(12) United States Patent
Ito et al.

(10) Patent No.: US 6,410,906 B1
(45) Date of Patent: Jun. 25, 2002

(54) ELECTRO-OPTIC PROBE

(75) Inventors: Akishige Ito; Katsushi Ohta; Toshiyuki Yagi, all of Tokyo; Mitsuru Shinagawa, Isehara; Tadao Nagatsuma, Sagamihara; Junzo Yamada, Ebina, all of (JP)

(73) Assignees: Ando Electric Co., Ltd.; Nippon Telegraph and Telephone, both of Tokyo (JP)

( * ) Notice: Subject to any disclaimer, the term of this patent is extended or adjusted under 35 U.S.C. 154(b) by 0 days.

(21) Appl. No.: 09/499,944

(22) Filed: Feb. 8, 2000

(30) Foreign Application Priority Data

Feb. 12, 1999 (JP) ............................................ 11-034996

(51) Int. Cl.⁷ ................................................. H01J 3/14
(52) U.S. Cl. ........................ 250/216; 250/225; 250/551
(58) Field of Search ............................. 250/216, 201.3, 250/225, 551, 559.09, 559.22, 559.4; 356/351, 352, 364, 376; 359/246, 247, 212, 213

(56) References Cited

U.S. PATENT DOCUMENTS

| | | | |
|---|---|---|---|
| 4,910,454 A | 3/1990 | Williamson | ............... 324/77 K |
| 4,982,151 A | 1/1991 | Takahashi et al. | ............ 324/96 |
| 5,334,849 A * | 8/1994 | Thomas et al. | ........ 250/559.22 |

FOREIGN PATENT DOCUMENTS

| | | |
|---|---|---|
| GB | 2 342 160 A | 4/2000 |
| WO | WO 89/09413 | 10/1989 |

OTHER PUBLICATIONS

German Office Action dated Jun. 8, 2001, issued during prosecution of GB 100 04 367.4–35.

* cited by examiner

*Primary Examiner*—Que T. Le
(74) *Attorney, Agent, or Firm*—Darby & Darby

(57) ABSTRACT

An electro-optic probe is provided which is able to prevent unnecessary reflected light from optical components in the electro-optic probe from entering photodiodes. The optical components which constitutes an isolator 13 are disposed inclining from an optical path of a parallel light emitted from a collimating lens 8, such that the unnecessary reflected light beams from these optical component surfaces are not incident to the photodiodes 10 and 11. The inclination angle of these optical components are set within a range from an angle formed by an optical path from said optical component to a light receiving element in said photodiode, and the diameter of said light receiving element to an angle allowable for the optical component to maintain the transmittance thereof.

4 Claims, 3 Drawing Sheets

ELECTRO-OPTIC PROBE

BACKGROUND OF THE INVENTION

1. Field of the Invention

The present invention relates to an electro-optic probe, which observes waveforms of test signals from the polarization state of an incident light when incident to an electro-optic crystal which is coupled with an electric field generated by the test signal, and particularly relates to an improved electro-optic probe.

2. Background Art

A waveform of a test signal can be measured from the polarization state of a laser light when the laser light enters an electro-optic crystal which is coupled with an electric field generated by the test signal. A very high time resolution can be obtained by use of a laser pulse and by executing sampling. Hereinafter, the electro-optic sampling oscilloscope is described which is formed by the use of such an electro-optic probe.

The electro-optic sampling oscilloscope (hereinafter called EOS oscilloscope) has following advantages over the conventional sampling oscilloscope using electric probes:

(1) Measurement is easy, because a ground line is not necessary during measurement.
(2) Since the metal pin disposed at the top of the electro-optic prove is insulated from the measuring circuit, a high input impedance is provided, which results in eliminating factors that disturb the conditions of the test point.
(3) The use of the light pulse allows carrying out wide band measurement reaching to the GHz order.

The structure of the conventional electro-optic probe used in the measurement of signals by the EOS oscilloscope will be described with reference to FIG. 3. In the electro-optic probe shown in FIG. 3, the numeral 1 denotes a probe head made of an insulator, and a metal pin 1a is inserted in the probe head 1. The reference numeral 2 denotes an electro-optic element and a reflecting film 2a is formed on an outside surface of the electro-optic element 2, to which the metal pin 1a contacts. The reference numerals 3 and 8 denote collimating lenses and the numeral 4 denotes a quarter-wave plate. The numerals 5 and 7 denote polarizing beam splitters. The numeral 6 denotes a Faraday element which rotates the plane of polarization 45 degrees. The numeral 9 denotes a laser diode for emitting a laser beam in response to a control signal output by an EOS oscilloscope body (not shown), which receives the output of the probe after converting the laser beam into electric signals. The numeral 12 denotes a probe body, and the numeral 13 denotes an optical isolator comprising the quarter-wave plate 4, polarizing beam splaitters 5 and 7, and the Faraday element 6.

Next, the optical path of the laser light emitted from the laser diode 9 will be described with reference to FIG. 3. The path of the laser light is represented by the reference symbol A.

The laser beam emitted from the laser diode 9 is collimated into a parallel beam by the collimating lens 8, and enters the electro-optic element 2, after rectilinearly advancing through the polarizing beam splitter 7, the Faraday element 6, and the polarized beam splitter 5, and further passing the quarter-wave plate 4 and condensed by the collimating lens 3. The light beam input into the electro-optic element 2 is reflected by the reflecting film 2a formed at the end surface of the electro-optic element 2 facing to the metal pin 1a.

The reflected laser beam enters the photodiode 16, after being collimated into a parallel beam by the collimating lens 3, passing the quarter-wave plate 4, and a part of the laser beam is reflected by the polarizing beam splitter 5. The part of the laser beam transmitted by the polarizing beam splitter 5 enters the photodiode 11 after being reflected by the polarizing beam splitter 5.

The rotation angles of the quarter-wave plate 4 are adjusted such that the intensities of two laser beams entering the two photodiodes becomes identical.

Hereinafter, the operation of measurement by the use of the electro-optic probe shown in FIG. 3 is described.

When the metal pin 1a contacts a test point, an electric field is generated at the metal pin 1a and the electric field propagates to the electro-optic element 2, which results in causing a change of the refractive index of the electro-optic element 2 due to the Pockels effect. When the laser beam emitted by the laser diode 9 enters and propagates through the electro-optic element after the refractive index of the electro-optic element changes, the polarization state of the laser light changes. The laser beam having the thus changed polarization state is introduced into the photodiodes 10 and 11 and is converted into an electric signal after being reflected by the reflecting film 2a and converted into the electric signals.

The change of the voltage applied to the measuring point is reflected as the change of the polarization state of the laser light by the electro-optic element 2, and the change of the polarization state is detected by the difference between the output from the photodiodes 10 and 11. Thus, the electric signal applied to the metal pin 1a can be measured as the difference betweeen the output of the photodiodes 10 and 11.

In the electro-optic probe shown above, the electric signals obtained from these photodiodes are input into an oscilloscope for processing, but it is possible to measure signals by connecting a controller for controlling the signal measurement between these photodiodes 10 and 11 and a measuring device such as a real time-type oscilloscope. Thereby, wide band measurement is facilitated by the use of the electro-optic probe.

However, in the conventional electro-optic probe, as shown by the symbol B in FIG. 3, the laser beam, regularly reflected at the surface of the quarter-wave plate 4a enters the photodiode 10 after being reflected by the polarizing beam splitter 5. This laser beam constitutes a noise and degrades the S/N ratio after being converted into the electric signal when observed by the oscilloscope. This noise beam is generated not only from the surface 4a of the quarter-wave plate 4, but also from the surface 5a of the polarizing beam splitter 5 as shown by the symbol C in FIG. 3 as well as from other optical components.

Although the reflectance of the optical components can be reduced by applying the antireflection coating, it is not possible to minimize the reflectance to null, and the costs of optical components may rise by applying the antireflection coating.

SUMMARY OF THE INVENTION

It is therefore an objective of the present invention to provide an electro-optic probe which is capable of reducing unnecessary reflected light and capable of improving the S/N ratio.

According to the first aspect of the present invention, an electro-optic prove comprises: a laser diode for emitting a laser beam based on control signals of an oscilloscope body; a first lens for collimating the laser beam into a parallel beam; a second lens for condensing said parallel beam; an electro-optic element having a reflecting film on one end surface; an isolator for isolating the reflected laser beam reflected by said reflecting film after the laser beam emitted by said laser diode passes to the reflecting film; and a plurality of photodiodes for converting the reflected laser beam after being separated by said isolator; wherein, optical components constituting said isolators are disposed inclining to the optical axis at an angle such that the light beams reflected on surfaces of said optical components by regular reflection does not enter said photodiodes.

According to the second aspect, in an electro-optic probe according to the first aspect, said plurality of photodiodes and said laser diode are connected to an electro-optic sampling oscillator and said laser diode emits a pulsed laser based on the control signal generated by said electro-optic sampling oscillator.

According to the third aspect, in an electro-optic probe according to the first aspect, said laser diode emits a continuous laser beam.

According to the fourth aspect, in an electro-optic probe according to the first aspect, said inclination angle of optical components is set within a range from an angle formed by an optical path from said optical component to a light receiving element in said photodiode and the diameter of said light receiving element to an angle allowable for the optical component to maintain the transmittance thereof.

DETAILED DESCRIPTION OF THE INVENTION

An electro-optic probe (hereinafter called probe) according to a preferable embodiment of the present invention is described hereinafter with reference to the attached drawings.

Figure 1:
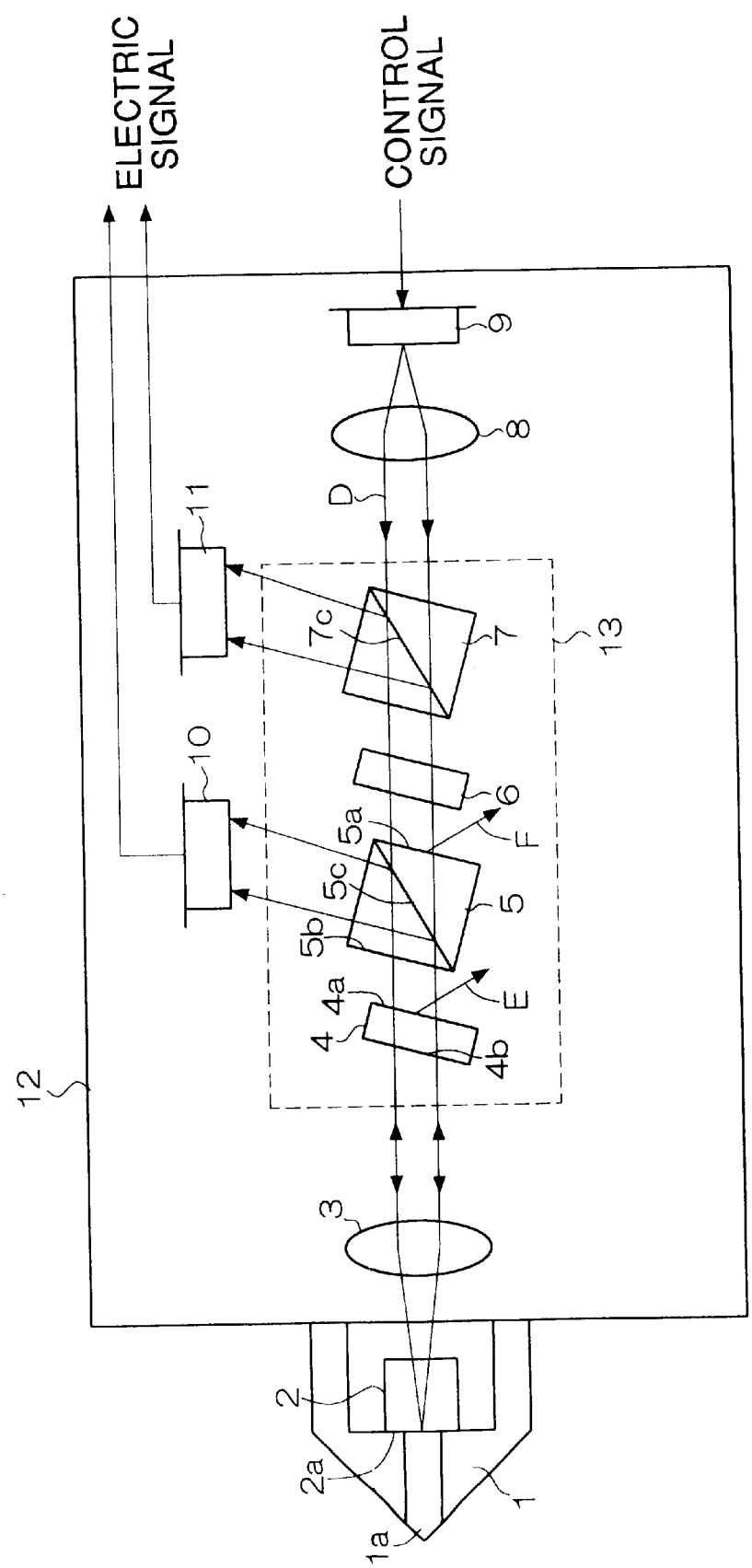
FIG. 1 is a diagram showing the structure of an embodiment of the present invention.
Figure 3:
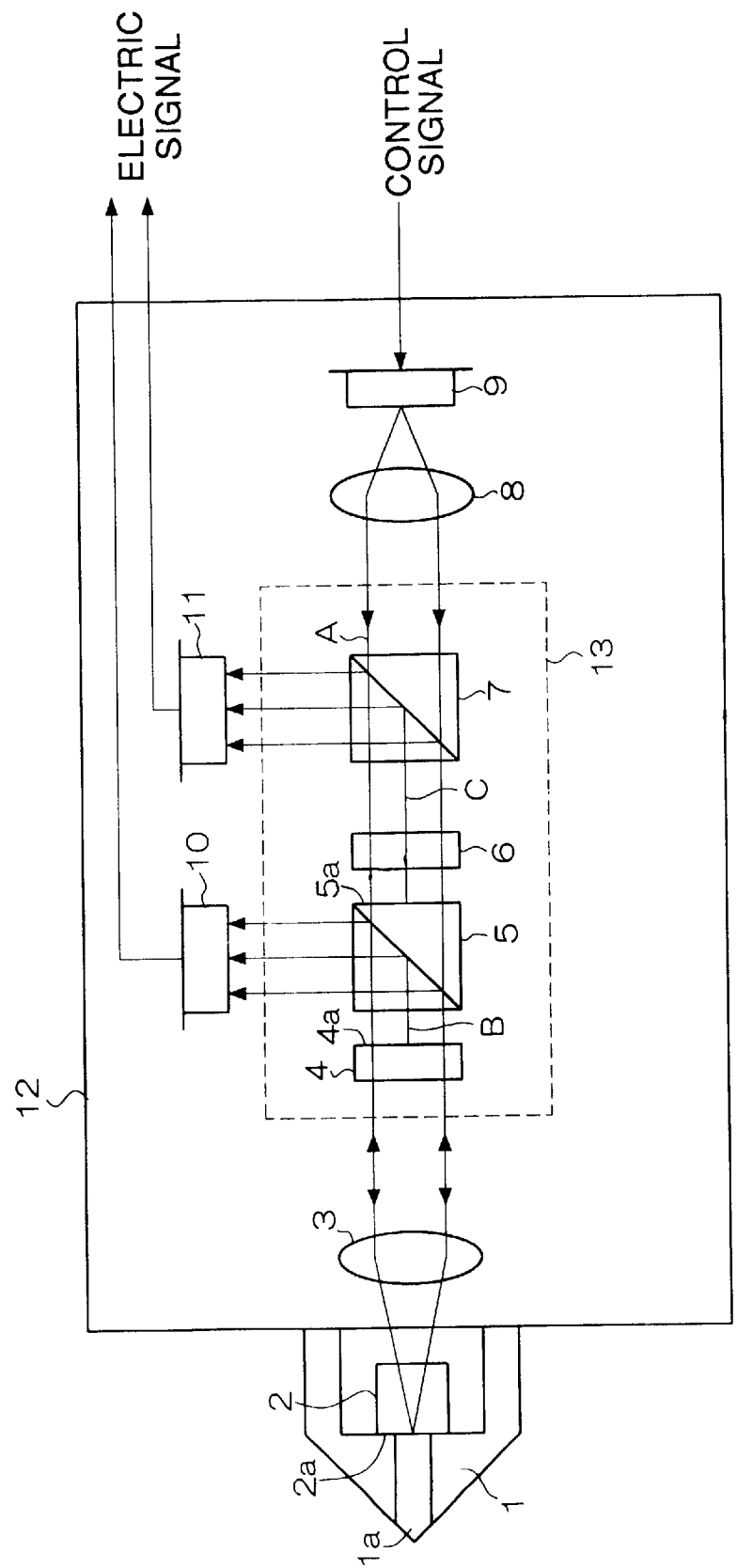
FIG. 3 is a diagram showing the structure of a conventional electro-optic probe.

FIG. 1 is a diagram showing the structure of an embodiment of the present invention. In FIG. 1, the same components as those shown in FIG. 3 are denoted by the same numerals and explanations are omitted. The probe shown in FIG. 1 differs from the conventional one in that the quarter-wave plate 4, the polarizing beam splitters 5 and 7 and the Faraday elements are attached at different angles. In addition, the photodiodes 10 and 11 are disposed at locations in the direction where the laser beam is reflected by respective reflecting surfaces 5c and 7c of the polarizing beam splitters 5 and 7 after the laser light is collimated by the collimating lens 3.

Next, an explanation describing the optical path of the laser beam emitted from the laser diode 9 will be presented. In FIG. 1, the optical path of the laser beam is denoted by the symbol D.

The laser beam emitted from the laser diode 9 is collimated into a parallel beam by a collimating lens, and advances progressively passing the polarizing beam splitter 7, the Faraday elements 6, and the polarizing beam splitter 5, and further passes the quarter-wave plate 4.

Next, the parallel light transmitted through the quarter wave plate 4 enters into the electro-optic element 2 after being condensed by the collimating lens 3 and reflected by the reflecting film formed on one surface of the electro-optic element 2 facing the metal pin 1a.

Since the collimating lens 3 is disposed at a location separated by the focal distance, the laser beam converted into the parallel beam is condensed into a point on the reflecting surface 2a.

The laser light reflected by the refleceting film 2a is again collimated by the collimating lens 3, passes the quarter-wave plate 4, and after separated by the polarizing beam splitters 5 and 7, enters the photodiodes 10 and 11, to be converted into electric signals.

Since the quarter-wave plate is disposed not vertically but at an angle inclined to the light axis, the laser beam reflected on the surface 4a of the quarter-wave plate 4 does not return to the light axis as shown by the symbol E. Thus, the reflected light at the surface 4a does not enter the photodiode 10. If this reflected light enters into the reflecting surface 5c of the polarizing beam splitter, the reflected light does not enter the photodiode 10, because the polarizing beam splitter 5 is disposed at an angle inclined to the light axis.

Since the polarizing beam splitter 5 is disposed at an inclined angle, the laser beam reflected at the reflecting surface 5a does not enter the photosiode 11. Similarly, the light beam reflected at the surface 4b of the quarter-wave plate 4 and at the surface 5b of the polarizing beam splitter 5 does not enter the photodiodes 10 and 11. In addition, the light beam reflected by the Faraday element 6 and the polarizing beam splitter 7 also does not enter the photodiodes 10 and 11.

The angle of these optical components is described hereinafter.

Figure 2:
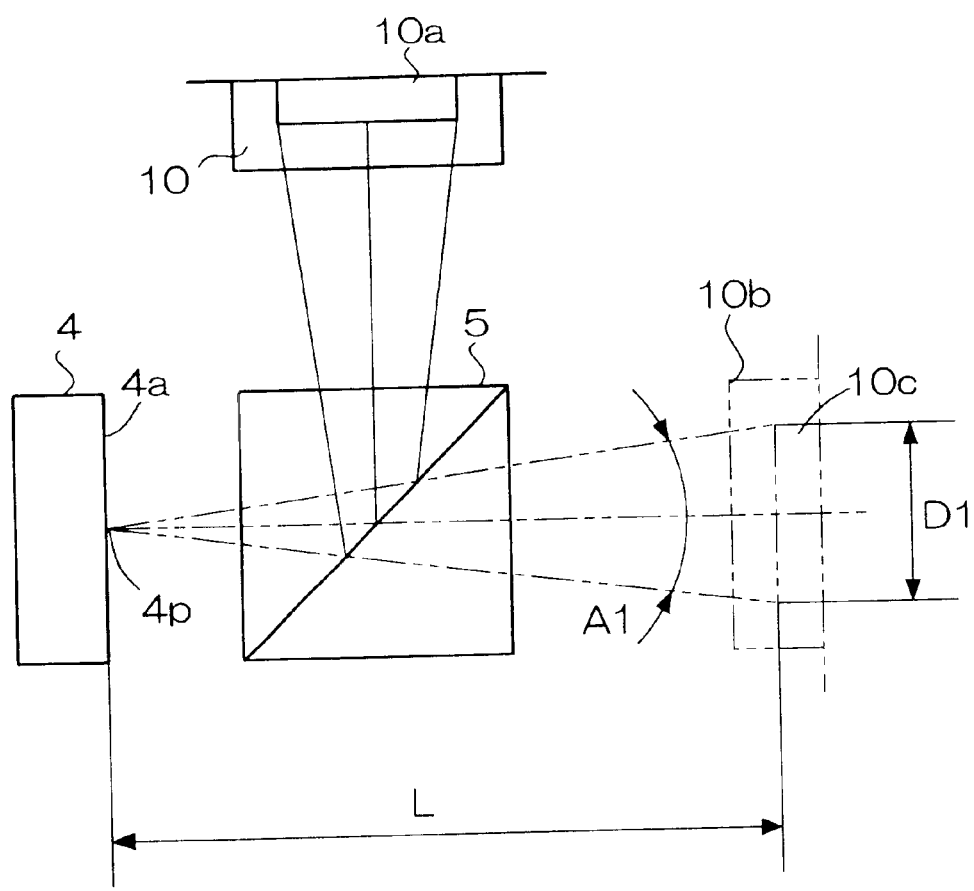
FIG. 2 is a diagram showing an optical path of the reflected light in the embodiment shown in FIG. 1.

FIG. 2 is a diagram showing an optical path of the laser beam reflected at the surface 4a of the quarter-wave plate 4. The numeral 10a denotes a light receiving element in the photodiode 10. The numerals 10b and 10c denote positions of photodiode 10 rotated by 90 degrees. The symbol L denotes an optical path length of the reflected beam and the symbol D1 denotes a light receiving diameter of the light receiving element 10a (10c). The symbol A1 denotes the angle when viewed from a point 4p on the surface 4a of the quarter-wave plate 4.

As shown in FIG. 2, among the laser beam reflected at the point 4p of the quarter-wave plate 4, only the reflected beam within the angle A1 enters the light receiving element.

Since the surface 4a of the quarter-wave plate is flat, the laser light is predominantly reflected by a regular reflection.

Thus, when the beam incident on the quarter-wave plate is parallel, and if the quarter-wave plate is inclined towards the light axis by an angle more than A1, the reflected beam at the point 4p is not incident to the light receiving element 10a.

The angle A1 can be expressed by the following equation.

$$A1 = 2 \cdot \tan^{-1}((D1/2)/L)$$

wherein, D1 represents the light receiving diameter of the light receiving element and L represents the optical path length.

Since the characteristics such as transmission of the optical components changes when they are inclined, the inclination angle is restricted in many cases.

Therefore, by determining the inclination angle of those optical components within a range from A1 to the maximum allowable angle that guarantees the characteristics, unnecessary reflected light can be prevented while maintaining the characteristic of each optical component.

In the structure shown in FIG. 1, four optical components are inclined towards the optical axis. However, since the influence of the unnecessary reflected light increases as the optical path length to the photodiodes 10 and 11 increases, the influence can be reduced by inclining only the optical components near the collimating lens 3.

The direction of inclination is either clock-wise or anti-clock wise, and when a plurality of optical components are inclined, the inclination directions of respective components need not be the same.

In the above mentioned embodiment, if a continuous laser is emitted in the electro-optic probe, it becomes possible to use conventional measuring devices such as a real-time oscilloscope, a sampling oscilloscope, or a spectrum analyzer. These conventional devices can be connected to the photodiodes, substituting the EOS oscilloscope, through the controller dedicated to the EO probe.

As described above, in the present invention, the effect has been obtained that the S/N ratio can be improved, since the optical components having the flat surface are inclined towards the optical axis so as to eliminate unnecessary reflected light returning to the light axis. In addition, another effect obtained is that it becomes possible to use optical components without applying an antireflection film.

The other effect is obtained since the inclination angles of optical components are restricted within the allowable range that guarantees the characteristics of the optical components, and thus the characteristics of the optical components can be maintained while preventing unnecessary reflected light from entering into the photodiodes. In addition, the disposition of optical components is facilitated because each optical components can be disposed at an inclination angle within a predetermined range.

What is claimed is:

1. An electro-optic probe comprises:
   a laser diode for emitting a laser beam based on control signals of an oscilloscope body;
   a first lens for collimating the laser beam into a parallel beam;
   a second lens for condensing said parallel beam;
   an electro-optic element having a reflecting film on one end surface;
   an isolator for isolating the reflected laser beam reflected by said reflecting film after the laser beam emitted by said laser diode passes to the reflecting film; and
   a plurality of photodiodes for converting the reflected laser beam into the electric signals after being separated by said isolator; wherein,
   optical components constituting said isolators are disposed inclining to the optical axis at an angle such that the light beams reflected on surfaces of said optical components by regular reflection do not enter said photodiodes.

2. An electro-optic probe according to claim 1, wherein said plurality of photodiodes and said laser diode are connected to an electro-optic sampling oscillator and said laser diode emits a pulsed laser based on the control signal generated by said electro-optic sampling oscillator.

3. An electro-optic probe according to claim 1, wherein said laser diode emits a continuous laser beam.

4. An electro-optic probe according to claim 1, wherein said inclination angle of optical components is set within a range from an angle formed by an optical path from said optical component to a light receiving element in said photo diode and the diameter of said light receiving element to an angle allowable for the optical component to maintain the transmittance thereof.

\* \* \* \* \*